US008080348B2

(12) United States Patent
Hayashida et al.

(10) Patent No.: US 8,080,348 B2
(45) Date of Patent: Dec. 20, 2011

(54) HOLOGRAM RECORDING MATERIAL AND HOLOGRAM RECORDING MEDIUM

(75) Inventors: Naoki Hayashida, Tokyo (JP); Atsuko Kosuda, Tokyo (JP); Jiro Yoshinari, Tokyo (JP)

(73) Assignee: TDK Corporation, Tokyo (JP)

( * ) Notice: Subject to any disclaimer, the term of this patent is extended or adjusted under 35 U.S.C. 154(b) by 504 days.

(21) Appl. No.: 12/061,971

(22) Filed: Apr. 3, 2008

(65) Prior Publication Data

US 2008/0254375 A1    Oct. 16, 2008

(30) Foreign Application Priority Data

Apr. 10, 2007 (JP) ................................ 2007-102713

(51) Int. Cl.
*G03H 1/02* (2006.01)
(52) U.S. Cl. .......... 430/1; 430/2; 430/281.1; 430/280.1; 359/3
(58) Field of Classification Search .................. None
See application file for complete search history.

(56) References Cited

U.S. PATENT DOCUMENTS

| | | | |
|---|---|---|---|
| 5,874,187 A * | 2/1999 | Colvin et al. ............... | 430/2 |
| 6,268,089 B1 | 7/2001 | Chandross et al. | |
| 6,479,193 B1 | 11/2002 | Maeda et al. | |
| 6,524,771 B2 | 2/2003 | Maeda et al. | |
| 6,914,703 B2 | 7/2005 | Tomita et al. | |
| 7,767,361 B2 | 8/2010 | Mizushima | |
| 7,883,821 B2 | 2/2011 | Kosuda et al. | |
| 7,932,000 B2 | 4/2011 | Hayashida et al. | |
| 7,939,221 B2 | 5/2011 | Kosuda et al. | |
| 2002/0110740 A1 | 8/2002 | Otaki et al. | |
| 2003/0044690 A1 * | 3/2003 | Rotto ............................. | 430/1 |
| 2004/0197670 A1 * | 10/2004 | Takeyama ..................... | 430/1 |
| 2004/0202942 A1 * | 10/2004 | Takeyama ..................... | 430/1 |
| 2006/0172203 A1 | 8/2006 | Mizushima | |
| 2007/0042275 A1 * | 2/2007 | Kamo ............................ | 430/1 |
| 2007/0111107 A1 | 5/2007 | Yoshinari et al. | |
| 2007/0111108 A1 | 5/2007 | Hayashida et al. | |
| 2007/0243473 A1 | 10/2007 | Mizushima et al. | |
| 2007/0243474 A1 | 10/2007 | Mizushima et al. | |
| 2008/0057404 A1 | 3/2008 | Kosuda et al. | |
| 2008/0057405 A1 | 3/2008 | Yoshinari et al. | |

(Continued)

FOREIGN PATENT DOCUMENTS

JP          6-148880          5/1994

(Continued)

OTHER PUBLICATIONS

Photoinitiators for UV curing, CIBA (2003 (8 pages).*

(Continued)

*Primary Examiner* — Martin Angebranndt
(74) *Attorney, Agent, or Firm* — Oblon, Spivak, McClelland, Maier & Neustadt, L.L.P.

(57) ABSTRACT

The present invention provides a hologram recording material which is suitable for volume hologram record and can attain high refractive index change, flexibility, high sensitivity, low scattering, environment resistance, that is, storage stability, durability, low dimensional change (low shrinkage) and high multiplicity in holographic memory record using not only a green laser but also a blue laser. A hologram recording material comprising: a metal oxide matrix; and a photopolymerizable compound which has at least one (meth)acrylamide group as a photo-reactive group, and has a polyalkylene glycol unit represented by the following formula:

—(RO)$_n$— wherein R represents a lower alkylene group, and n represents the number of repeating units of alkylene oxide.

15 Claims, 2 Drawing Sheets

U.S. PATENT DOCUMENTS

| | | |
|---|---|---|
| 2008/0057406 A1 | 3/2008 | Hayashida et al. |
| 2008/0070124 A1* | 3/2008 | Matsumoto et al. ............... 430/2 |
| 2008/0076033 A1 | 3/2008 | Hayashida et al. |
| 2008/0145307 A1 | 6/2008 | Kosuda et al. |
| 2008/0160421 A1 | 8/2008 | Hayashida et al. |
| 2008/0193857 A1 | 8/2008 | Kosuda et al. |
| 2008/0268349 A1 | 10/2008 | Kosuda et al. |
| 2009/0091810 A1 | 4/2009 | Yoshinari et al. |
| 2009/0092904 A1 | 4/2009 | Hayashida et al. |
| 2009/0097085 A1 | 4/2009 | Hayashida et al. |
| 2009/0186281 A1 | 7/2009 | Kosuda et al. |
| 2010/0086859 A1 | 4/2010 | Hayashida et al. |

FOREIGN PATENT DOCUMENTS

| | | |
|---|---|---|
| JP | 2953200 | 7/1999 |
| JP | 11-344917 | 12/1999 |
| JP | 2001-281429 | 10/2001 |
| JP | 2002-236439 | 8/2002 |
| JP | 2002-236440 | 8/2002 |
| JP | 2003-43903 | 2/2003 |
| JP | 2005-77740 | 3/2005 |
| JP | 2005-99612 | 4/2005 |
| JP | 2005-321674 | 11/2005 |
| JP | 2006-225446 * | 8/2006 |

OTHER PUBLICATIONS

Notification of Reasons for Refusal issued on Sep. 6. 2011 in the corresponding Japanese Patent Application No. 2007-102713.

U.S. Appl. No. 13/107,281, filed May 13, 2011, Hayashida, et al.

* cited by examiner

HOLOGRAM RECORDING MATERIAL AND HOLOGRAM RECORDING MEDIUM

BACKGROUND OF THE INVENTION

1. Field of the Invention

The present invention relates to a hologram recording material suitable for volume hologram recording, and a hologram recording medium having a hologram recording layer made of the hologram recording material.

2. Disclosure of the Related Art

Research and development of holographic memories have been advanced as recording technique making it possible to attain large-capacity recording and high-speed data transmission. Examples of the property required for a hologram recording material include high refractive index change at the time of recording, high sensitivity, low scattering, environment resistance, that is, storage stability, durability, low dimension change, high multiplicity, and the like.

As a hologram recording material, attention has been paid to an organic-inorganic hybrid material, which is made mainly of an inorganic matrix and a photopolymerizable monomer, and the hybrid material has been investigated. The inorganic matrix is excellent in environment resistance and durability.

For example, Japanese Patent No. 2953200 (Patent Document 1) discloses an optical recording film wherein a photopolymerizable monomer or oligomer and a photopolymerization initiator are contained in an inorganic substance network film. As the photopolymerizable monomer, disclosed is a monofunctional (meth)acrylic acid ester, a polyfunctional (meth) acrylic acid ester, or the like (paragraph [0017]).

JP-A-11-344917 (Patent Document 2) discloses an optical recording medium wherein an organic-inorganic hybrid matrix contains therein a photo active monomer. As the photo active monomer, disclosed is an acrylic acid ester monomer such as diethylene glycol monoethyl ether acrylate (paragraph [0018]).

JP-A-2002-236439 (Patent Document 3) discloses a hologram recording material comprising: a matrix made of an organic-inorganic hybrid polymer obtained by copolymerizing an organometallic compound containing an ethylenically unsaturated double bond and an organic monomer having an ethylenically unsaturated double bond, as main chain constituting components, and/or a hydrolyzed polycondensate thereof; a photopolymerizable compound; and a photopolymerization initiator. As the photopolymerizable compound, a photo-radical polymerizable compound or a photo-cation polymerizable compound is described (paragraph [0041]); and as the photo-radical polymerizable compound, a (meth) acrylic acid ester monomer is disclosed (paragraphs [0042] to [0043]).

JP-A-2005-77740 (Patent Document 4) discloses a hologram recording material comprising metal oxide particles, a polymerizable monomer, and a photopolymerization initiator. As the polymerizable monomer, a (meth)acrylic acid ester monomer is disclosed (paragraph [0020]).

JP-A-2005-99612 (Patent Document 5) discloses a hologram recording material comprising a compound having one or more polymerizable functional groups, a photopolymerization initiator, and colloidal silica particles. As one species of the polymerizable functional groups, a (meth) acrylic acid ester monomer is disclosed (paragraphs [0019] to [0022]). As a different example thereof, an acrylamide (for example, ethylenebisacrylamide) is disclosed (paragraph [0023]).

JP-A-2005-321674 (Patent Document 6) discloses a hologram recording material comprising: an organometallic compound at least containing at least two kinds of metals (Si and Ti), oxygen, and an aromatic group, and having an organometallic unit wherein two aromatic groups are directly bonded to one metal (Si); and a photopolymerizable compound. As the photopolymerizable compound, a radical polymerizable compound or a cation polymerizable compound is described (paragraph [0039]); and as the radical polymerizable compound, a (meth)acrylic acid ester is disclosed (paragraph [0041]).

Patent Document 1: Japanese Patent No. 2953200
Patent Document 2: JP-A-11-344917
Patent Document 3: JP-A-2002-236439
Patent Document 4: JP-A-2005-77740
Patent Document 5: JP-A-2005-99612
Patent Document 6: JP-A-2005-321674

SUMMARY OF THE INVENTION

In the above Patent Documents 1 to 4, and 6, a (meth) acrylic acid ester is disclosed as the photopolymerizable monomer. However, the (meth)acrylic acid ester is easily hydrolyzed under an acidic or basic condition. Moreover, the (meth)acrylic acid ester is easily subjected to transesterification reaction by interaction between the ester and a metal alkoxide compound or an oligomer thereof, which is a material for forming a metal oxide matrix. Accordingly, when the (meth)acrylic acid ester is used as a photopolymerizable monomer in a metal oxide matrix, the (meth) acrylic acid ester is gradually decomposed so as to deteriorate the hologram recording property of the recording material.

In the above Patent Document 5, the acrylamide (for example, ethylenebisacrylamide) is exemplified as the photopolymerizable monomer. However, ethylenebisacrylamide is low in hydrophilicity, and therefore, is not evenly dispersed in a metal oxide matrix.

Any of the above-mentioned Patent Documents 1 to 6 disclose holographic memory record using a green laser, but do not disclose holographic memory record using a blue laser.

As the wavelength of a recording/reproducing laser is shorter, any hologram recording layer is required to have a higher mechanical strength, a higher flexibility, a higher homogeneity, and environment resistance (that is, storage stability). If the mechanical strength of the hologram recording layer is insufficient, an increase in the shrinkage of the layer when recording is made or a fall in the storage reliability is caused. In particular, in order to obtain a sufficient contrast based on refractive index modulation by means of a recording/reproducing laser having a wavelength in the short wavelength region, it is preferred to make the microscopic mechanical strength high up to some degree, and restrain monomer-shift and dark reaction after the layer is exposed to light for recording. If the flexibility of the hologram recording layer is insufficient, the shift of the photopolymerizable monomer in the layer is hindered in recording so that the sensitivity falls. If the homogeneity is insufficient, scattering is caused at the time of recording/reproducing. Thus, the reliability of the recording/reproducing itself deteriorates. An effect of the scattering based on the insufficient homogeneity of the recording layer becomes remarkable more easily in the case of a recording/reproducing laser having a wavelength in the short wavelength region.

An object of the present invention is to provide a hologram recording material which is suitable for volume hologram record and can attain high refractive index change, flexibility, high sensitivity, low scattering, environment resistance, that is, storage stability, durability, low dimensional change (low shrinkage) and high multiplicity in holographic memory record using not only a green laser but also a blue laser.

The present invention includes the followings:

(1) A hologram recording material comprising:
   a metal oxide matrix; and
   a photopolymerizable compound which has at least one (meth)acrylamide group as a photo-reactive group, and has a polyalkylene glycol unit represented by the following formula:

—(RO)$_n$— wherein R represents a lower alkylene group, and n represents the number of repeating units of alkylene oxide.

(2) The hologram recording material according to the above-described (1), wherein the photopolymerizable compound has a polyethylene glycol unit represented by the following formula:

—(CH$_2$CH$_2$O)$_n$— wherein n represents the number of repeating units of ethylene oxide.

(3) The hologram recording material according to the above-described (1) or (2), wherein the number of the repeating units is 3 or more.

(4) The hologram recording material according to any one of the above-described (1) to (3), wherein the metal oxide matrix is formed from a matrix-forming material containing a metal alkoxide compound and/or an oligomer thereof.

(5) The hologram recording material according to any one of the above-described (1) to (4), wherein the metal oxide matrix is formed from a matrix-forming material containing a Si alkoxide compound and/or an oligomer thereof.

(6) The hologram recording material according to any one of the above-described (1) to (5), wherein the metal oxide matrix is formed from a matrix-forming material containing at least one metal alkoxide compound selected from the group consisting of a Ti alkoxide compound, a Zr alkoxide compound, a Ta alkoxide compound and a Sn alkoxide compound, and/or an oligomer of the metal alkoxide.

(7) The hologram recording material according to any one of the above-described (1) to (6), wherein the metal oxide matrix is formed from a matrix-forming material containing:
   a Si alkoxide compound and/or an oligomer thereof; and
   at least one metal alkoxide compound selected from the group consisting of a Ti alkoxide compound, a Zr alkoxide compound, a Ta alkoxide compound and a Sn alkoxide compound, and/or an oligomer of the metal alkoxide.

(8) The hologram recording material according to any one of the above-described (1) to (7), which further comprises a photopolymerization initiator.

(9) A hologram recording medium which has a hologram recording layer comprising the hologram recording material according to any one of the above-described (1) to (8).

(10) The hologram recording medium according to the above-described (9), wherein the hologram recording layer has a thickness of at least 100 µm.

(11) The hologram recording medium according to the above-described (9) or (10), wherein record/reproduction of said hologram recording medium are performed using a laser light having a wavelength of 350 to 450 nm.

The hologram recording material of the present invention contains a specific photopolymerizable compound which has a (meth)acrylamide group as a photo-reactive group, and has a polyalkylene glycol unit. Since the specific photopolymerizable compound has a polyalkylene glycol unit which is hydrophilic, the compound is good in compatibility with all of a metal oxide matrix; and a metal alkoxide compound and an oligomer which is a partially condensate of said metal alkoxide compound, at the stage of the formation of the matrix. Thus, the photopolymerizable compound is homogeneously dispersed in the metal oxide matrix. Since the specific photopolymerizable compound has, as its photo-reactive group, a (meth)acrylamide group which is stable against hydrolysis, the compound is stable at all stages of a formation stage of a hologram recording layer (a formation stage of the metal oxide matrix), at a storage stage after the production of a hologram recording medium and before the medium is exposed to light for recording, and another storage stage after the medium is exposed to the light for the recording.

Accordingly, the hologram recording medium using the hologram recording material of the present invention can give a sufficient sensitivity and a sufficient refractive index modulation in recording/reproducing using a blue laser as well as a green laser. The medium is also excellent in storage stability after recording is made in the medium. Furthermore, the hologram recording layer is so homogeneous that light scattering is not caused when recording or reproducing is made. As a result, the reliability of the medium for recording/reproducing is high.

DETAILED DESCRIPTION OF THE INVENTION

Figure 1:
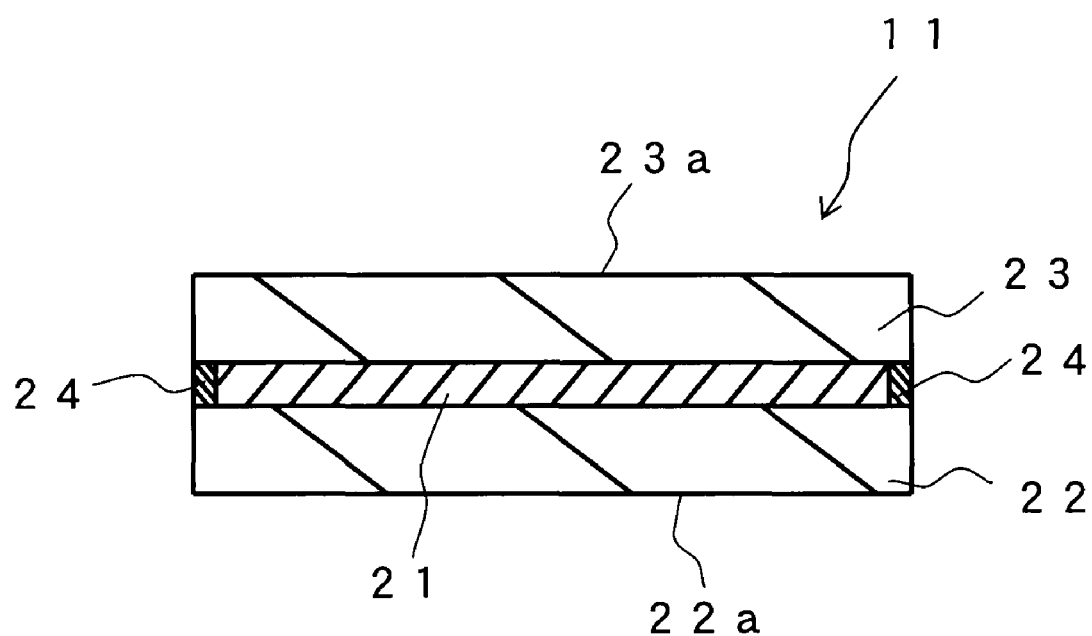
FIG. 1 is a view illustrating a schematic cross section of a hologram recording medium produced in the example.

The hologram recording material of the present invention is a composition containing a metal oxide (namely organic-inorganic hybrid) matrix and a photopolymerizable compound (namely monomer). The hologram recording medium of the present invention has a hologram recording layer comprising the hologram recording material. In the present specification, a hologram recording layer may be called a hologram recording material layer.

The metal oxide matrix can be formed by sol-gel reaction (that is, hydrolysis and polycondensation) of a matrix-forming material containing a metal alkoxide compound and/or an oligomer which is a partially hydrolytic condensate of said metal alkoxide compound. The matrix is in a gel or sol form. The metal oxide functions as a matrix or a dispersing medium for the photopolymerizable compound in the hologram recording material layer. In other words, the photopolymerizable compound in a liquid phase is evenly dispersed with good compatibility in the gel- or sol-form metal oxide matrix.

When light having coherency is irradiated onto the hologram recording material layer, the photopolymerizable organic compound (monomer) undergoes polymerization reaction in the exposed portion so as to be polymerized, and further the photopolymerizable organic compound diffuses and shifts from the unexposed portion into the exposed portion so that the polymerization of the exposed portion further advances. As a result, an area where the polymer produced from the photopolymerizable organic compound is large in amount and an area where the polymer is small in amount are formed in accordance with the intensity distribution of the light. At this time, the metal oxide shifts from the area where the polymer is large in amount to the area where the polymer is small in amount, so that the area where the polymer is large in amount becomes an area where the metal oxide is small in amount and the area where the polymer is small in amount becomes an area where the metal oxide is large in amount. In this way, the light exposure causes the formation of the area where the polymer is large in amount and the area where the metal oxide is large in amount. When a refractive index difference exists between the polymer and the metal oxide, a refractive index change is recorded in accordance with the light intensity distribution.

In order to obtain a better recording property in the hologram recording material, it is necessary that a difference is large between the refractive index of the polymer produced from the photopolymerizable compound and that of the metal oxide. The refractive indices of the polymer and the metal oxide may be designed so as to make any one of the refractive indices high (or low).

When the metal oxide is prepared to have a lower refractive index than that of the polymer produced from the photopolymerizable compound in the design of the hologram recording material, it is advisable to use Si at a relatively large content by percentage. On the other hand, when the metal oxide is prepared to have a higher refractive index than that of the polymer produced from the photopolymerizable compound, it is advisable to use Ti, Zr, Ta, Sn or the like at a relatively large content by percentage.

As described above, the metal oxide matrix may be formed from a matrix-forming material which contains a Si alkoxide compound and/or an oligomer (that is, partially hydrolytic condensate) thereof. The metal oxide matrix may be formed from a matrix-forming material which contains, besides the Si alkoxide compound and/or the oligomer thereof, at least one metal alkoxide compound selected from the group consisting of a Ti alkoxide compound, a Zr alkoxide compound, a Ta alkoxide compound and a Sn alkoxide compound, and/or an oligomer (that is, partially hydrolytic condensate) of the metal alkoxide compound.

The metal alkoxide compound as the matrix-forming material is represented by the following general formula (I):

$(R_2)_j M(OR_1)_k$      (I)

wherein $R_2$ represents an alkyl group or an aryl group; $R_1$ represents an alkyl group; M represents a metal; j represents 0, 1, 2 or 3, and k represents an integer of 1 or more provided that j+k is equal to the valence of the metal M; and when $R_2$s are present in accordance with j, $R_2$s may be different or the same, and when $R_1$s are present in accordance with k, $R_1$s may be different or the same.

The alkyl group represented by $R_2$ is usually a lower alkyl group having about 1 to 4 carbon atoms. Examples thereof include methyl, ethyl, propyl, isopropyl, butyl, isobutyl, and sec-butyl groups, and the like. An example of the aryl group represented by $R_2$ is a phenyl group. The alkyl group and the aryl group may each have a substituent.

The alkyl group represented by $R_1$ is usually a lower alkyl group having about 1 to 4 carbon atoms. Examples thereof include methyl, ethyl, propyl, isopropyl, butyl, isobutyl, and sec-butyl groups, and the like. The alkyl group may have a substituent.

Examples of the metal atom represented by M include Si, Ti, Zr, Ta and Sn. Other examples thereof include Ge, Al, Zn, and the like. In the present invention, it is preferred to use at least two alkoxide compounds represented by the general formula (I) containing Ms different from each other, and it is preferred that one of two Ms is Si and the other metal M, which is different from Si, is selected from the group consisting of Ti, Zr, Ta and Sn. Examples of combination of the two metals include a combination of Si and Ti, that of Si and Ta, and that of Si and Zr. Of course, three metals may be combined with each other. The incorporation of the two or more metals as constituent elements into the matrix makes it easy to control characteristics of the metal oxide matrix, such as the refractive index thereof; thus, the incorporation is preferred for the design of the recording material.

Specific examples of the alkoxide compound (I) wherein M is Si include tetramethoxysilane, tetraethoxysilane, and tetrapropoxysilane, in each of which j=0 and k=4; methyltrimethoxysilane, ethyltrimethoxysilane, propyltrimethoxysilane, methyltriethoxysilane, ethyltriethoxysilane, propyltriethoxysilane, γ-mercaptopropyltrimethoxysilane, γ-mercaptopropyltriethoxysilane, γ-aminopropyltrimethoxysilane, γ-aminopropyltriethoxysilane, phenyltrimethoxysilane, phenyltriethoxysilane, and phenyltripropoxysilane, in each of which j=1, and k=3; dimethyldimethoxysilane, dimethyldiethoxysilane, and diphenyldimethoxysilane, in each of which j=2, and k=2; and the like.

Of these silicon compounds, preferred are, for example, tetramethoxysilane, tetraethoxysilane, methyltrimethoxysilane, ethyltrimethoxysilane, methyltriethoxysilane, ethyltriethoxysilane, and the like.

Furthermore, diphenyldimethoxysilane is preferred. When an organometallic unit wherein two phenyl groups (Phs) are bonded directly to one Si atom (Ph-Si-Ph) is incorporated into a metal oxide matrix, the flexibility of the metal oxide matrix is improved and further the compatibility thereof with the photopolymerizable compound, which will be detailed later, or an organic polymer produced by the polymerization of the compound becomes good. Thus, the incorporation of the organometallic unit is preferred. Moreover, the refractive index of the metal oxide also becomes high. The diphenylalkoxide compound of Si is easily available as a starting material, and has good reactivity in hydrolysis and polymerization. The phenyl groups may each have a substituent.

When a monoalkoxysilane (j=3 and k=1) such as trimethylmethoxysilane is present, the polymerization reaction is stopped; thus, the monoalkoxysilane can be used to adjust the molecular weight.

The alkoxide compound (I) of a metal M other than Si is not particularly limited, and specific examples thereof include alkoxide compounds of Ti, such as tetrapropoxytitanium, and tetrabutoxytitanium; alkoxide compounds of Ta, such as pentaethoxytantalum [Ta(OEt)$_5$], and tetraethoxytantalum pentanedionate [Ta (OEt)$_4$ (C$_5$H$_7$O$_2$)]; and alkoxide compounds of Zr, such as tetra-t-butoxyzirconium [Zr(O-tBu)$_4$], and tetra-n-butoxyzirconium [Zr(O-nBu)$_4$]. Metal alkoxide compounds besides these examples may be used.

An oligomer of the metal alkoxide compound (I) (corresponding to a partially hydrolytic condensate of the metal alkoxide compound (I)) may be used. For example, a titaniumbutoxide oligomer (corresponding to a partially hydrolytic condensate of tetrabutoxytitanium) may be used. The metal alkoxide compound (I) and the oligomer of the metal alkoxide compound (I) may be used together.

The metal oxide matrix may contain an element other than the above in a very small amount.

In the present invention, the photopolymerizable compound is a photo-radical polymerizable monomer, and has, in the molecule thereof, at least one (meth)acrylamide group as a photo-reactive group, and has a polyalkylene glycol unit represented by the following formula:

—(RO)$_n$— wherein R represents a lower alkylene group, for example, an alkylene group having 1 to 4 carbon atoms, and n represents the number of repeating units of alkylene oxide (that is, the weight-average polymerization degree). The wording "(meth)acrylamide group" is a wording for expressing a methacrylamide group and an acrylamide group collectively.

Specific examples of the lower alkylene group include methylene, ethylene, 1,3-propylene, 1,2-propylene, 1,4-butylene, and 1,3-butylene groups. Of these groups, ethylene and 1,3-propylene groups are preferred from the viewpoint of hydrophilicity. An ethylene group is more preferred. In other words, the photopolymerizable compound is preferably a compound having a polyethylene glycol unit:

—(CH$_2$CH$_2$O)$_n$—.

From the viewpoint of hydrophilicity and restraint of recording shrinkage, the number n of the repeating units is preferably 3 or more, more preferably 4 or more and 50 or less, even more preferably 5 or more and 30 or less.

The photopolymerizable compound is classified into a monofunctional compound, which has in the molecule thereof a single (meth)acrylamide group, and a polyfunctional compound, which has in the molecule thereof two or more (meth) acrylamide groups.

Since the specific photopolymerizable compound has a polyalkylene glycol unit which is hydrophilic, the compound is good in compatibility with all of a metal oxide matrix; and a metal alkoxide compound and an oligomer which is a partially condensate of said metal alkoxide compound, at the stage of the formation of the matrix. Thus, the photopolymerizable compound is homogeneously dispersed in the metal oxide matrix. Since the specific photopolymerizable compound has, as its photo-reactive group, a (meth) acrylamide group which is stable against hydrolysis, the compound is stable at all stages of a formation stage of a hologram recording layer (a formation stage of the metal oxide matrix), at a storage stage after the production of a hologram recording medium and before the medium is exposed to light for recording, and another storage stage after the medium is exposed to the light for the recording.

Accordingly, the hologram recording medium using the hologram recording material containing the specific photopolymerizable compound can give a sufficient sensitivity and a sufficient refractive index modulation in recording/reproducing using a blue laser as well as a green laser. The medium is also excellent in storage stability after recording is made in the medium. Furthermore, the hologram recording layer is so homogeneous that light scattering is not caused when recording or reproducing is made. As a result, the reliability of the medium for recording/reproducing is high.

One kind of the specific photopolymerizable compound may be used, or two or more kinds thereof may be used together. In the present invention, in the case of making the refractive index of the metal oxide high and making the refractive index of the organic polymer low, the specific photopolymerizable compound which forms the organic polymer is preferable since the compound has no aromatic group to give a low refractive index (for example, a refractive index of 1.5 or less).

The specific photopolymerizable compound which has in the molecule thereof a single (meth)acrylamide group can be prepared, for example, by dehydration from one equivalent of an N-hydroxyalkyl (meth) acrylamide compound and one equivalent of a polyalkylene glycol compound, thereby producing a mono(meth)acrylamide alkyl ether of polyalkylene glycol.

The alkyl group in the N-hydroxyalkyl(meth)acrylamide compound is preferably, for example, an alkyl group having 1 to 20 carbon atoms. The alkyl group may have a substituent. Specific examples of the N-hydroxyalkyl(meth)acrylamide compound include N-hydroxymethyl(meth)acrylamide, N-hydroxyethyl(meth)acrylamide, and the like.

The polyalkylene glycol compound may be used in the form of a monoalkyl ether thereof. In the case of using a monoalkyl ether of the polyalkylene glycol compound, the alkyl group in the compound is preferably, for example, an alkyl group having 1 to 20 carbon atoms. The alkyl group may have a substituent. Specific examples of the polyalkylene glycol compound include polyethylene glycol, polyethylene glycol monomethyl ether, polyethylene glycol monoethyl ether, and the like.

Instead of the N-hydroxyalkyl (meth) acrylamide compound, an N-hydroxyalkyl-N-alkyl(meth)acrylamide compound represented by the following formula (II) may be used:

$$CH_2=C(R_5)-CON(R_4)-R_3OH \qquad (II).$$

In the formula (II), $R_5$ represents a hydrogen atom or a methyl group, —$R_3$OH represents a hydroxy alkyl group, and $R_4$ represents an alkyl group. The alkyl group $R_4$ is preferably, for example, an alkyl group having 1 to 20 carbon atoms. The alkyl group $R_4$ may have a substituent, and $R_4$ may have a hydroxyl group. When $R_4$ has a hydroxyl group, a compound having a single polyalkylene glycol chain is obtained by using one equivalent of the polyalkylene glycol compound per one equivalent of the (meth)acrylamide compound (II). When $R_4$ has a hydroxyl group, a compound having two polyalkylene glycol chains is obtained by using two equivalents of the polyalkylene compound per one equivalent of the (meth) acrylamide compound (II).

The specific photopolymerizable compound which has in the molecule thereof two (meth)acrylamide groups can be prepared, for example, by dehydration from two equivalents of an N-hydroxyalkyl (meth) acrylamide compound and one equivalent of a polyalkylene glycol compound, thereby producing a bis(meth)acrylamide alkyl ether of polyalkylene glycol.

As the N-hydroxyalkyl(meth)acrylamide compound, for example, the same as in the case of the above-mentioned compound having in the molecule thereof a single (meth) acrylamide group may be used. Instead of the N-hydroxyalkyl(meth)acrylamide compound, the same N-hydroxyalkyl-N-alkyl(meth)acrylamide compound (II) as described above may be used.

The specific photopolymerizable compound which has in the molecule thereof three or more (meth)acrylamide groups can be prepared, for example, by synthesizing a polyethylene oxide adduct of a polyol compound such as glycerol, erythritol or dipentaerythritol in advance, and then subjecting this adduct and an N-hydroxyalkyl (meth) acrylamide compound to dehydrating condensation, thereby producing the corresponding (meth)acrylamide alkyl ether.

In the present invention, a (meth)acrylic acid ester monomer may be used together with the above-mentioned specific photopolymerizable compound as long as the attainment of the object of the present invention is not damaged. The use amount of the (meth) acrylic acid ester monomer should be set to, for example, an amount up to 10% by weight of the total of the photopolymerizable compound(s).

Examples of the (meth)acrylic acid ester monomer include monofunctional (meth)acrylates such as phenoxyethyl (meth)acrylate, 2-methoxyethyl (meth)acrylate, 2-hydroxyethyl (meth)acrylate, benzyl (meth)acrylate, cyclohexyl (meth)acrylate, ethoxydiethylene glycol (meth)acrylate, methoxypolyethylene glycol (meth)acrylate, methyl (meth)acrylate, polyethylene glycol (meth)acrylate, polypropylene glycol (meth)acrylate, and stearyl (meth)acrylate; and polyfunctional (meth)acrylates such as trimethylolpropane tri(meth)acrylate, pentaerythritol tetra(meth)acrylate, dipentaerythritol hexa(meth)acrylate, diethylene glycol di(meth)

acrylate, triethylene glycol di(meth)acrylate, tetraethylene glycol di(meth)acrylate, polyethylene glycol di(meth)acrylate, bis(2-hydroxyethyl)isocyanurate di(meth)acrylate, and 2,2-bis[4-(acryloxy-diethoxy)phenyl]propane. However, the compound having a (meth)acryloyl group is not necessarily limited thereto.

It is advisable that in the present invention the photopolymerizable compound is used, for example, in an amount of about 5 to 1,000% by weight of total (as a nonvolatile component) of the metal oxide matrix, preferably in an amount of 10 to 300% by weight thereof. If the amount of the photopolymerizable compound is less than 5% by weight, a large refractive index change is not easily obtained at the time of recording. If the amount of the photopolymerizable compound is more than 1,000% by weight, a large refractive index change is not easily obtained, either, at the time of recording.

In the present invention, the hologram recording material further contains a photopolymerization initiator corresponding to the wavelength of recording light. When the photopolymerization initiator is contained in the hologram recording material, the polymerization of the photopolymerizable compound is promoted by the light exposure at the time of recording. Consequently, a higher sensitivity is achieved.

Since a radical polymerizable compound is used as the photopolymerizable compound, a photo radical initiator is used. Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the photopolymerizable compound.

The hologram recording material composition may contain a dye that functions as a photosensitizer corresponding to the wavelength of recording light or the like besides the photopolymerization initiator. Examples of the photosensitizer include thioxanthones such as thioxanthen-9-one, and 2,4-diethyl-9H-thioxanthen-9-one; xanthenes; cyanines; melocyanines; thiazines; acridines; anthraquinones; and squaliriums. It is advisable to set an amount to be used of the photosensitizer into the range of about 5 to about 50% by weight of the radical photoinitiator, for example, about 10% by weight thereof.

A process for producing the hologram recording material will be described in the following.

The metal oxide matrix may be prepared by causing a metal alkoxide compound and/or an oligomer of the metal alkoxide to undergo hydrolysis and polymerization reaction (the so-called sol-gel reaction).

The hydrolysis and polymerization reaction may be carried out by the same operation under the same conditions as in known sol-gel methods. For example, the reaction may be conducted by dissolving predetermined metal alkoxide compound starting material(s) into a preferred organic solvent to prepare a homogenous solution, adding an appropriate acid catalyst dropwise to the solution, and stirring the solution in the presence of water. The amount of the solvent is not limited, and is preferably 10 to 1,000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis and polymerization reaction, which depends on the reactivity of the metal alkoxide compound starting material(s), may be conducted, in general, at room temperature (about 20 to 30° C.) for 0.5 hour or more and 5 hours or less, preferably 0.5 hour or more and 3 hours or less. The reaction may be conducted in the atmosphere of an inert gas such as a nitrogen gas, or may be conducted under a reduced pressure of about 0.5 to 1 atm while an alcohol generated by the polymerization reaction is removed.

Before, during or after the hydrolysis, the photopolymerizable organic compound is mixed. The photopolymerizable organic compound may be mixed with the metal alkoxide compounds as the starting materials after, during or before the hydrolysis. In the case of the mixing after the hydrolysis, it is preferred to add and mix the photopolymerizable organic compound in the state that the sol-gel reaction system containing the metal oxide and/or the metal oxide precursor is sol in order to perform the mixing uniformly. The mixing of a photopolymerization initiator or photosensitizer can also be conducted before, during or after the hydrolysis.

The polycondensation reaction of the metal oxide precursor, with which the photopolymerizable compound is mixed, is advanced to yield a hologram recording material liquid wherein the photopolymerizable compound is uniformly incorporated in a metal oxide matrix in a sol-form. The hologram recording material liquid is applied onto a substrate, and then drying of the solvent and a sol-gel reaction are further advanced, thereby yielding a hologram recording material layer in a film form. In such a way, the hologram recording material layer is produced wherein the photopolymerizable compound is uniformly contained in a metal oxide matrix.

The hologram recording medium of the present invention comprises at least the above-mentioned hologram recording material layer. Usually, a hologram recording medium comprises a supporting substrate (i.e., a substrate) and a hologram recording material layer; however, a hologram recording medium may be made only of a hologram recording material layer without having any supporting substrate. For example, a medium composed only of a hologram recording material layer may be obtained by forming the hologram recording material layer onto the substrate by application, and then peeling the hologram recording material layer off from the substrate. In this case, the hologram recording material layer is, for example, a layer having a thickness in the order of millimeters.

The hologram recording medium is either of a medium having a structure for performing reproduction using transmitted light (hereinafter referred to as a transmitted light reproducing type medium), and a medium having a structure for performing reproduction using reflected light (hereinafter referred to as a reflected light reproducing type medium) in accordance with an optical system used for the medium.

The hologram recording medium of the present invention is suitable for record and reproduction using not only a green laser light but also a blue laser light having a wavelength of 350 to 450 nm. When the reproduction is made using transmitted light, the medium preferably has a light transmittance of 50% or more at a wavelength of 405 nm. When the reproduction is made using reflected light, the medium preferably has a light reflectance of 25% or more at a wavelength of 405 nm.

When the above described hologram recording material is used, a hologram recording medium having a recording layer thickness of 100 μm or more, which is suitable for data storage, can be obtained. The hologram recording medium can be produced by forming the hologram recording material in a film form onto a substrate, or sandwiching the hologram recording material in a film form between substrates.

In a transmitted light reproducing type medium, it is preferred to use, for the substrate(s), a material transparent to a recording/reproducing wavelength, such as glass or resin. It is preferred to form an anti-reflection film against the recording/reproducing wavelength for preventing noises or give address signals and so on, onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

About the reflected light reproducing type medium, it is preferred that the substrate positioned at the medium surface side into which a reproducing laser light is irradiated is made of a material transparent to a recording and reproducing wavelength, such as glass or resin. As the substrate positioned at the medium surface side opposite to the medium surface side into which a reproducing laser light is irradiated, a substrate having thereon a reflective film is used. Specifically, a reflective film made of, for example, Al, Ag, Au or an alloy made mainly of these metals and the like is formed on a surface of a rigid substrate (which is not required to have a light-transmitting property), such as glass or resin, by vapor deposition, sputtering, ion plating, or any other film-forming method, whereby a substrate having thereon the reflective film is obtained. A hologram recording material layer is provided so as to have a predetermined thickness on the surface of the reflective film of this substrate, and further a light-transmitting substrate is caused to adhere onto the surface of this recording material layer. An adhesive layer, a flattening layer and the like may be provided between the hologram recording material layer and the reflective film, and/or between the hologram recording material layer and the light-transmitting substrate. It is also unallowable that these optional layers hinder the transmission of the laser light. Others than this matter are the same as in the above-mentioned transmitted light reproducing type medium.

The hologram recording medium which has the hologram recording layer comprising the hologram recording material of the present invention can be preferably used not only in a system wherein record and reproduction are made using a green laser light but also in a system wherein record and reproduction are made using a blue laser light having a wavelength of 350 to 450 nm.

EXAMPLES

The present invention will be specifically described by way of the following examples; however, the invention is not limited to the examples.

Example 1

Synthesis of an Acrylamide-Containing Monomer

From N-(hydroxymethyl)acrylamide and polyethylene glycol monomethyl ether, a target compound (A) of monoacrylamide methyl ether/monomethyl ether of polyethylene glycol represented by the following formula was synthesized in accordance with a method described in JP-A-2006-225446:

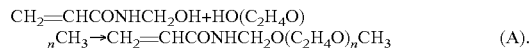

A mixed solution of 100 parts by weight of N-(hydroxymethyl)acrylamide (manufactured by Wako Pure Chemical Industries, Ltd.), 266 parts by weight of polyethylene glycol monomethyl ether (manufactured by Alfa Aesar Co. in UK, weight-average molecular weight Mw=350), 0.3 part by weight of p-toluenesulfonic acid, and 0.2 part by weight of hydroquinone was heated to 60° C. in the flow of nitrogen gas, and then was reacted for 10 hours. Next, the volatile components were distilled off at 40° C. under reduced pressure. Thereafter, an unreacted fraction of N-(hydroxymethyl)acrylamide was removed by preparative liquid chromatography, so as to isolate a product. The isolated product was dried under reduced pressure to obtain the target compound (A). The structure of the compound was identified by $^1$H-NMR.

(Synthesis of a Matrix Material)

Mixed were 7.9 g of diphenyldimethoxysilane and 7.2 g of a titanium butoxide oligomer represented by the formula illustrated below (B-10, manufactured by Nippon Soda Co., Ltd.) to prepare a metal alkoxide mixed liquid. The mole ratio of Ti/Si was 1/1.

A solution composed of 1.0 mL of water, 0.3 mL of a 1N aqueous solution of hydrochloric acid, and 7 mL of 1-methoxy-2-propanol was dropwise added to the metal alkoxide mixed liquid at a room temperature while the mixed liquid was stirred. The resultant was continuously stirred for 2 hours to conduct hydrolysis and condensation reaction. The ratio of the metal alkoxide starting materials in the whole of the reaction solution was 67% by mass. In this way, a sol solution was obtained.

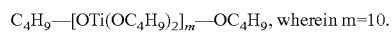

(Photopolymerizable Compound)

To 100 parts by mass of monoacrylamide methyl ether/monomethyl ether of polyethylene glycol (A) which was synthesized in the above-mentioned step as a photopolymerizable compound, were added 3 parts by mass of a photopolymerization initiator IRGACURE-907 (IRG-907, manufactured by Ciba Specialty Chemicals K.K.), and 0.3 part by mass of thioxanthen-9-one as a photosensitizer, so as to prepare a mixture containing the photopolymerizable compound.

(Hologram Recording Material Solution)

The sol solution and the mixture containing the photopolymerizable compound were mixed with each other at a room temperature to set the ratio of the matrix material (as a non-volatile component) and that of the photopolymerizable compound to 67 parts by weight and 33 parts by weight, respectively, to obtain a hologram recording material solution substantially transparent and colorless.

(Hologram Recording Material)

With reference to FIG. 1, which schematically illustrates a cross section of a hologram recording medium, explanation will be described.

A glass substrate (22) having a thickness of 1 mm and having one surface on which an anti-reflection film (22a) was formed was prepared. A spacer (24) having a predetermined thickness was put on a surface of the glass substrate (22) on which the anti-reflection film (22a) was not formed, and the hologram recording material solution obtained was applied onto the surface of the glass substrate (22). The resultant was dried at a room temperature for 1 hour, and then dried at 40° C. for 48 hours to volatilize the solvent. Through this drying step, the gelation (condensation reaction) of the organic group-containing metal oxide was advanced so as to yield a hologram recording material layer (21) having a dry film thickness of 450 μm wherein the organic group-containing metal oxide and the photopolymerizable compound were uniformly dispersed.

(Hologram Recording Medium)

The hologram recording material layer (21) formed on the glass substrate (22) was covered with another glass substrate (23) having a thickness of 1 mm and having one surface on which an anti-reflection film (23a) was formed. At this time, the covering was carried out in such a manner that a surface of the glass substrate (23) on which the anti-reflection film (23a) was not formed would contact the surface of the hologram recording material layer (21). In this way, a hologram recording medium (11) was obtained which had a structure wherein the hologram recording material layer (21) was sandwiched between the two glass substrates (22) and (23).

(Evaluation of Characteristics)

Figure 2:
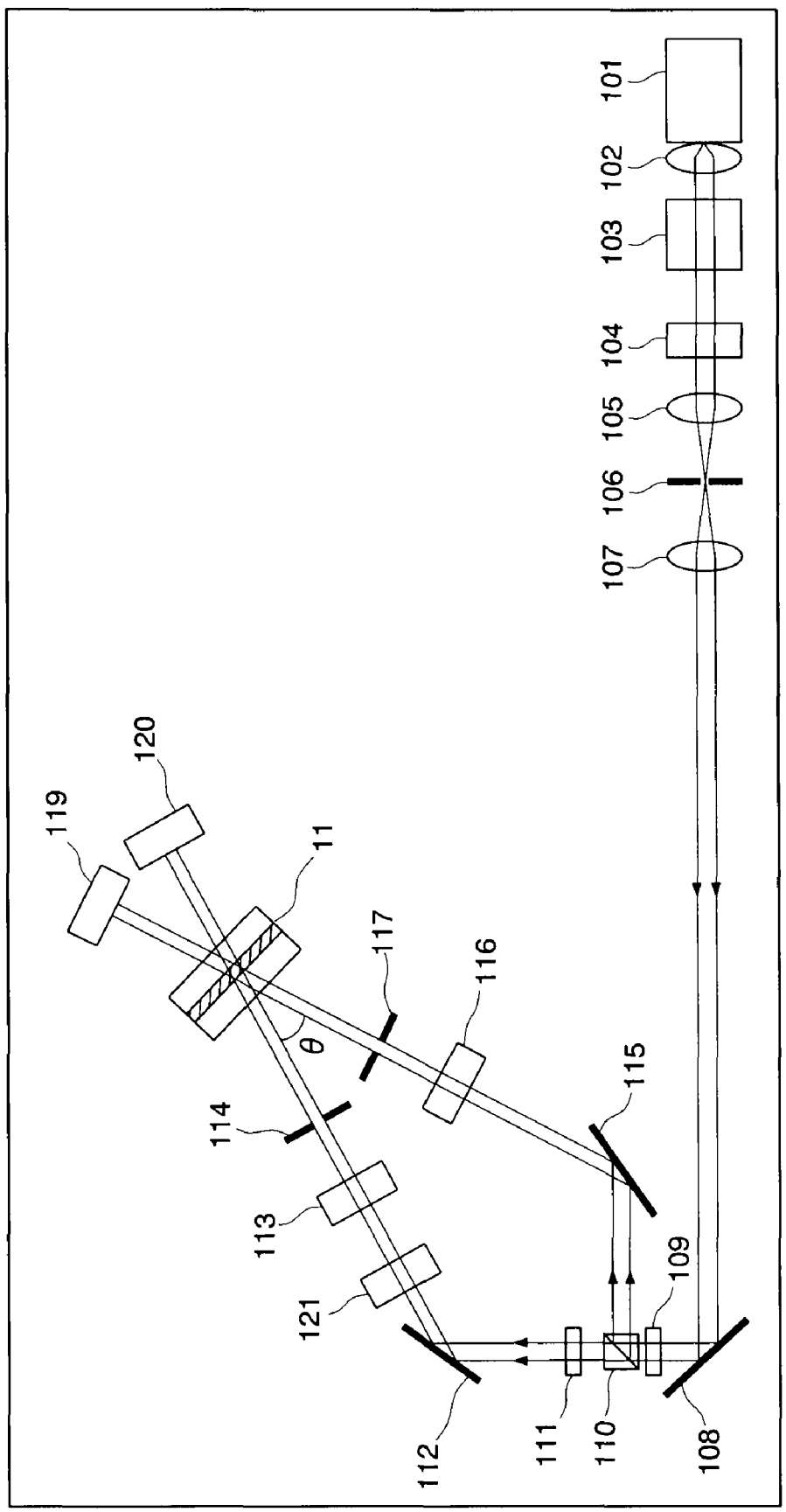
FIG. 2 is a plane view illustrating the outline of a hologram recording optical system used in the example.

About the resultant hologram recording material sample of Example 1, characteristics thereof were evaluated in a hologram recording optical system as illustrated in FIG. 2. The direction along which the paper surface on which FIG. 2 is drawn stretches is defined as a horizontal direction for convenience' sake.

In FIG. 2, the hologram recording medium sample (11) was set to make the recording material layer perpendicular to the horizontal direction.

In the hologram recording optical system illustrated in FIG. 2, a light source (101) for emitting a semiconductor laser (wavelength: 405 nm) in a single mode oscillation was used. Light emitted from this light source (101) was subjected to a spatial filtrating treatment by means of a beam rectifier (102), a light isolator (103), a shutter (104), a convex lens (105), a pinhole (106), and a convex lens (107), so as to be collimated, thereby enlarging the light into a beam diameter of about 10 mmϕ. The enlarged beam was passed through a mirror (108) and a ½ wavelength plate (109) to take out 45° (45 degree) polarized light. The light was split into an S wave and a P wave (the ratio of S wave/P wave is 1/1) through a polarized beam splitter (110). The S wave obtained by the splitting was passed through a mirror (115), a polarizing filter (116), and an iris diaphragm (117) while a ½ wavelength plate (111) was used to convert the P wave obtained by the splitting to an S wave and then the S wave was passed through a mirror (112), a polarizing filter (113) and an iris diaphragm (114). In this way, the total incident angle θ of the two light fluxes irradiated into the hologram recording medium sample (11) was set to 37°, so as to record interference fringes of the two light fluxes in the sample (11).

The sample (11) was rotated in the horizontal direction to attain multiplexing (angle multiplexing; sample angle: −21° to +21°, angle interval: 0.6°), thereby attaining hologram recording. The multiplicity was 71. At the time of recording, the sample was exposed to the light while the iris diaphragms (114) and (117) were each set to a diameter of 4 mm. At a position where the angle of the surfaces of the sample (11) to the bisector (not illustrated) of the angle θ made by the two light fluxes was 90°, the above-mentioned sample angle was set to ±0°.

After the hologram recording, in order to react remaining unreacted components, a sufficient quantity of blue light having a wavelength of 400 nm was irradiated to the whole of the surface of the sample (11) from a blue LED. At this time, the light was irradiated through an acrylic resin diffuser plate having a light transmittance of 80% so as to cause the irradiated light not to have coherency (the light irradiation is called post-cure).

At the time of reproduction, with shading by the shutter (121), the iris diaphragm (117) was set into a diameter of 1 mm and only one light flux was irradiated. The sample (11) was continuously rotated into the horizontal direction from −23° to +23°. In the individual angle positions, the diffraction efficiency was measured with a power meter (120). When a change in the volume (a recording shrinkage) or a change in the average refractive index of the recording material layer is not generated before and after the recording, the diffraction peak angle in the horizontal direction at the time of the recording is consistent with that at the time of the reproduction. Actually, however, a recording shrinkage or a change in the average refractive index is generated; therefore, the diffraction peak angle in the horizontal direction at the time of the reproduction is slightly different from the diffraction peak angle in the horizontal direction at the time of the recording. For this reason, at the time of the reproduction, the angle in the horizontal direction was continuously changed and then the diffraction efficiency was calculated from the peak intensity when a diffraction peak made its appearance. In FIG. 2, reference number (119) represents a power meter not used in this example.

At this time, a dynamic range M/# (the sum of the square roots of the diffraction efficiencies) was a high value of 19.2, which was a converted value corresponding to the case that the thickness of the hologram recording material layer was converted to 1 mm.

The hologram recording medium sample of Example 1 was allowed to stand still at a room temperature for one week, and then evaluated about the recording/reproducing property thereof in the same way. As a result, a dynamic range M/# was 18.8, which was substantially equal to the initial value.

Comparative Example 1

A hologram recording medium was obtained in the same way as in Example 1 except that a composition described below was used as a mixture containing a photopolymerizable compound.

(Photopolymerizable Compound)

To 100 parts by mass of polyethylene glycol diacrylate (M-245, manufactured by Toagosei Co., Ltd.) as a photopolymerizable compound were added 3 parts by mass of a photopolymerization initiator IRGACURE-907 (IRG-907, manufactured by Ciba Specialty Chemicals K.K.), and 0.3 part by mass of thioxanthen-9-one as a photosensitizer, so as to prepare a mixture containing the photopolymerizable compound.

About the resultant hologram recording medium sample, the property thereof was evaluated in the same way as in Example 1. The initial dynamic range M/# was 17.9, which was a converted value corresponding to the case that the thickness of the hologram recording material layer was converted to 1 mm. However, after the sample was allowed to stand still at a room temperature for one week, the dynamic range M/# was 10.5, which was a largely deteriorated value.

What is claimed is:
1. A hologram recording material comprising:
a metal oxide matrix; and
a photopolymerizable compound which has at least one (meth)acrylamide group as a photo-reactive group, and has a polyalkylene glycol unit represented by the following formula:

—(RO)$_n$— wherein R represents a lower alkylene group, and n represents the number of repeating units of alkylene oxide.

2. The hologram recording material according to claim 1, wherein the photopolymerizable compound has a polyethylene glycol unit represented by the following formula:

—(CH$_2$CH$_2$O)$_n$— wherein n represents the number of repeating units of ethylene oxide.

3. The hologram recording material according to claim 1, wherein the number of the repeating units is 3 or more.

4. The hologram recording material according to claim 1, wherein the metal oxide matrix is formed from a matrix-forming material comprising a metal alkoxide compound and/or an oligomer thereof.

5. The hologram recording material according to claim 1, wherein the metal oxide matrix is formed from a matrix-forming material comprising a Si alkoxide compound and/or an oligomer thereof.

6. The hologram recording material according to claim 1, wherein the metal oxide matrix is formed from a matrix-forming material comprising at least one metal alkoxide compound selected from the group consisting of a Ti alkoxide compound, a Zr alkoxide compound, a Ta alkoxide compound and a Sn alkoxide compound, and/or an oligomer of the metal alkoxide.

7. The hologram recording material according to claim 1, wherein the metal oxide matrix is formed from a matrix-forming material comprising:

a Si alkoxide compound and/or an oligomer thereof; and
at least one metal alkoxide compound selected from the group consisting of a Ti alkoxide compound, a Zr alkoxide compound, a Ta alkoxide compound and a Sn alkoxide compound, and/or an oligomer of the metal alkoxide.

8. The hologram recording material according to claim 1, which further comprises a photopolymerization initiator.

9. A hologram recording medium comprising a substrate or support and a hologram recording layer comprising the hologram recording material according to claim 1 thereon.

10. The hologram recording material according to claim 1, wherein the metal oxide matrix is formed from diphenyldimethoxysilane.

11. The hologram recording material according to claim 1, wherein the metal oxide matrix is formed from a mixture of diphenyldimethoxysilane and a titanium butoxide oligomer.

12. The hologram recording material according to claim 1, wherein the photopolymerizable compound has only one (meth)acrylamide group as a photo-reactive group.

13. The hologram recording material according to claim 1, wherein the photopolymerizable compound has at least two (meth)acrylamide groups as a photo-reactive group.

14. The hologram recording material according to claim 1, wherein the photopolymerizable compound is obtained by dehydration from one equivalent of a polyoxyalkylene compound and one equivalent of a (meth)acrylamide which has the formula CH$_2$=C(R$_5$)—CON(R$_4$)—R$_3$OH, wherein R$_5$ represents a hydrogen or a methyl group, —R$_3$OH represents a hydroxy alkyl group, and R$_4$ represents an alkyl group, optionally substituted with a hydroxyl group.

15. The hologram recording material according to claim 14, wherein the hydroxyl group is present on R$_4$.

* * * * *